United States Patent [19]

Chen et al.

[11] Patent Number: 5,414,059
[45] Date of Patent: May 9, 1995

[54] LOW BROMINE-CONTENT MATERIALS FOR MANUFACTURING PRINTED CIRCUIT BOARDS

[75] Inventors: Chuen-Chyr Chen, Taichung; Ker-Ming Chen, Hsinchu, both of an, Prov. of China

[73] Assignee: Industrial Technology Research Institute, Chutung, Taiwan, Prov. of China

[21] Appl. No.: 905,046

[22] Filed: Jun. 25, 1992

Related U.S. Application Data

[63] Continuation-in-part of Ser. No. 520,463, May 8, 1990, abandoned.

[51] Int. Cl.$^6$ ............... C08G 59/14; C08L 62/02; C08L 63/04; C08K 5/07
[52] U.S. Cl. ............... 525/527; 525/486; 523/428
[58] Field of Search ............... 525/527, 486, 527; 523/428

[56] References Cited

U.S. PATENT DOCUMENTS

| | | | |
|---|---|---|---|
| 4,294,877 | 10/1981 | Graham | 525/527 |
| 4,433,078 | 2/1984 | Kersten et al. | 525/527 |
| 5,041,519 | 8/1991 | Pan et al. | 528/102 |
| 5,326,794 | 7/1994 | Pan et al. | 525/528 |

FOREIGN PATENT DOCUMENTS

| | | | |
|---|---|---|---|
| 64-1756 | 1/1964 | Japan | 525/527 |
| 56-93727 | 7/1981 | Japan. | |
| 57-00418 | 12/1982 | Japan. | |
| 61-55161 | 3/1986 | Japan. | |
| 62-39618 | 2/1987 | Japan | 525/527 |

*Primary Examiner*—Robert E. Sellers
*Attorney, Agent, or Firm*—W. Wayne Lianh

[57] ABSTRACT

A resinous material for the manufacture of printed circuit boards is obtained by (a) treating a mixture of bromine- and nonbromine-containing epoxy resins with a secondary diamine such as 5,5-dimethyl hydantion or barbituric acid in the presence of a tertiary amine catalyst to form a modified epoxy resin; (b) heating the modified epoxy resin and a polyisocyanate in the presence of an encyclization catalyst; and (c) dissolving the resulting product in a solvent with a curing agent to form a B-stage prepreg varnish.

10 Claims, No Drawings

LOW BROMINE-CONTENT MATERIALS FOR MANUFACTURING PRINTED CIRCUIT BOARDS

BACKGROUND OF THE INVENTION

This application is a continuation-in-part of application Ser. No. 07/520,463, filed May 8, 1990, now abandoned.

Conventionally, multifunctional epoxy resins may be used for the production of printed circuit boards of high glass transition temperature (Tg). However, there are some disadvantages, these drawbacks include high brittleness and poor fire resistance in the cured state.

As an antidote to the above disadvantages, the industry developed a bifunctional bromine-containing resin blended in the multifunctional epoxy resin to increase its toughness and fire resistance in the cured state. However, such a bifunctional bromine-containing resin always greatly reduces its Tg.

In order to solve these new problems, a modified low bromine- or nonbromine-containing epoxy resin and a suitable curing agent are employed in the present invention to obtain a high Tg, improve the fire resistance, and overcome the brittleness. These improvements will increase the utility substantially.

The Tg of conventional FR-4 resin is about 110° C. to 130° C., and the bromine content of the material is about 22% (based on the amount of the material containing no glass sheet). Hence, multifunctional epoxy resin was always added to increase its Tg. But the addition of multifunctional epoxy resin not only unavoidably makes the product too brittle, a problem of poor fire resistance also exists because no bromine is contained. According to literature, in the field polyisocyanurate was known as a good heat resistant and fire resistant material. But it is difficult to make a B-stage prepreg from polyisocyanurate owing to its brittleness. Therefore, it is seldom used in the production of printed circuit boards.

Japanese patents 1978-30697 and 1987-74649 disclose the use of polyoxazolidone to overcome the brittleness of polyisocyanurate. Yet unfortunately this sacrifices the heat resistance and fire resistance. Further, the long term storage stability of the B-stage prepreg thereof is poor. So, it is not suitable for the production of B-stage prepreg for the manufacturing of printed circuit boards.

Moreover, in Japanese patent 1982-3815 the hydroxyl group of an epoxy resin was used to block isocyanates for the formation of polyurethane resins. It is further converted to a heat-resistant resin having an oxazolidone structure after some procedures with the use of a catalyst at a high temperature. A long compression time and a high viscosity of the varnish resulting in processing difficulties are the main disadvantages.

SUMMARY OF THE INVENTION

This invention is to synthesize a low bromine-containing polyoxazolidone prepolymer using a commercial curing agent and solvent, so as to obtain a B-stage prepreg with good storage stability and a long pot life for the production of multilayer printed circuit boards. This invention improves the Tg, fire resistance, reduces the brittleness of conventional FR-4, and also improves the processibility and storage problems of polyoxazolidone-isocyanurate.

The material, according to this invention, has the advantages of excellent electrical properties, adhesiveness, toughness, good heat-resistance, moisture-resistance, fire resistance and easy processing. It is fully suitable for the production of multilayer printed circuit board.

DETAILED DESCRIPTION OF THE INVENTION

The raw materials used in this invention primarily include: (a) bromine- and/or nonbromine-containing epoxy resins, (b) polyisocyanates, (c) secondary diamines, (d) encyclization catalysts, (e) curing agents.

The manufacturing steps and the amount of each component used are described as follows.

(1) A mixture of bromine- and nonbromine-containing epoxy resin selected from the group consisting of:

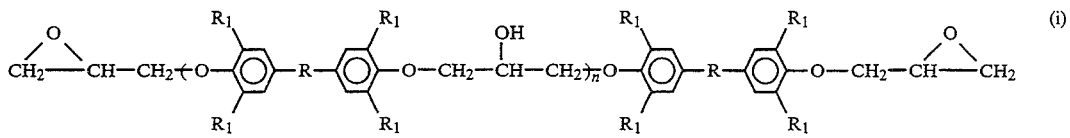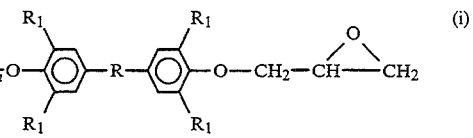

wherein
R is an alkyl group of 1–4 carbon atoms,
$R_1$ is H or Br,
n is a integer from 0 to 2;
the epoxide equivalent is from 150 to 575

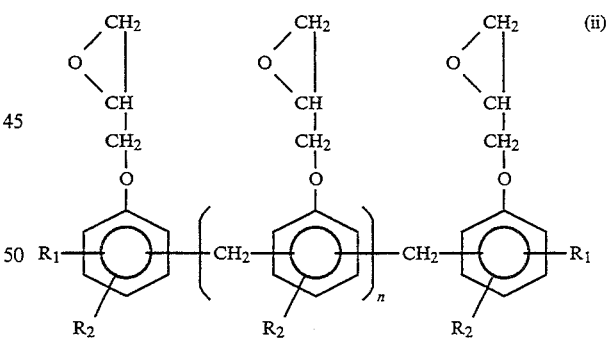

wherein
$R_1$ is H or $CH_3$, $R_2$ is H or Br,
n is a integer from 1 to 4;
the epoxide equivalent is from 150 to 350,

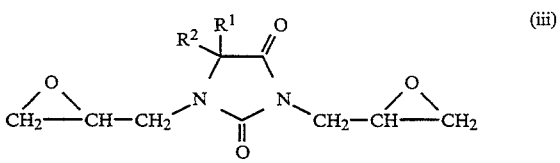

wherein each $R_1$ and $R_2$ is independently H or $CH_3$, or and

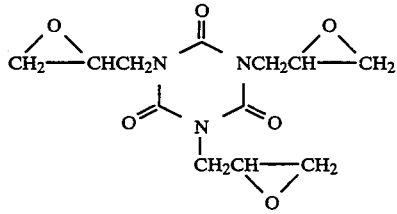

is treated with a secondary diamine selected from the group consisting of:

(i)

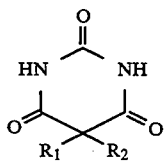

wherein each $R_1$ and $R_2$ is independently H, $CH_3$ $C_2H_5$, $C_6H_5$ (ii)

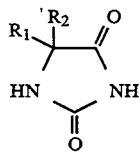

wherein each $R_1$ and $R_2$ is independently H, $CH_3$, $C_2H_5$ and $C_6H_5$ (iii)

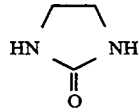

at a temperature from about 100° C. to about 150° C. for from about 1 to about 5 hours in the presence of a tertiary amine as a catalyst. The molar ratio of the secondary diamine to the epoxy group is from about 0.01 to about 0.5. A modified epoxy resin thus obtained is a transparent and slightly yellow solid.

(2) A polyisocyanate selected from the group consisting of:

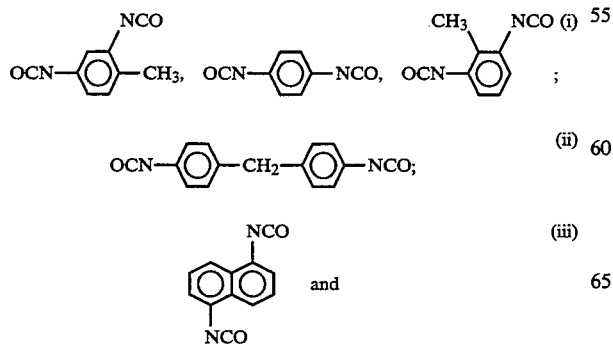

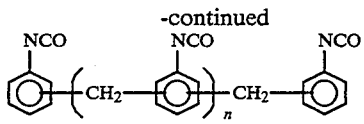

wherein n is an integer from 0 to 2
is added to react with the modified epoxy resin for from about 3 to about 6 hours at from about 130° C. to about 160° C. in the presence of an encyclization catalyst selected from the group consisting of a tertiary amine, a tertiary alcoholate salt and a quaternary ammonium salt in an amount of from about 0.01% to about 1% by weight of the total amount of epoxy resins, polyisocyanate and secondary diamine. The equivalent ratio of isocyanate group to epoxy group is from about 0.25:1 to about 0.8:1; the equivalent ratio of hydroxyl group to isocyanate group is from about 0.1:1 to about 0.5:1. An amber-colored solid resin is obtained after the reaction is completed and cooled.

(3) A B-stage prepreg varnish with excellent storage stability is formed by dissolving the product obtained from step (2) in an appropriate solvent and adding a curing agent selected from the group consisting of:

(i) diamine of the formula $NH_2RNH_2$ wherein R is:

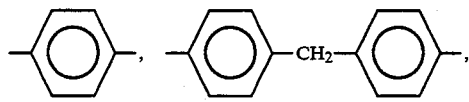

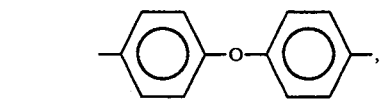

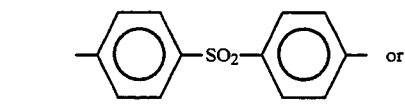

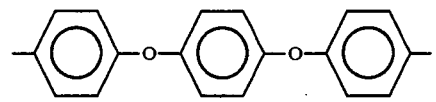

(ii) dicyandiamide
(iii) dianhydride
(iv) polycarboxylic acid.

The equivalent ratio of the dissolved product obtained from step (2) to the curing agent added is from about 0.85:1 to about 1.0:1.

EXAMPLE 1

5,5-dimethyl hydantoin (26 g) and N,N-dimethylbenzylamine (0.2 g) were added to a mixture of DOW DER 332 (340 g, a bromine-containing epoxy resin from Dow Chemical Co.) and DOW DER 542 (179 g, a bromine-containing epoxy resin from Dow Chemical Co.). The mixture was heated at 140° C. for 2 hours. MDI (160 g, methylene diphenyl isocyanate) and tetraethyl ammonium bromide (0.7 g) were added to the mixture and heated at a raised temperature of 150° C. for about 3 hours. An amber-colored resin having an epoxide equivalent of 486 with fire resistance and heat resistance was obtained after cooling. Acetone (370 g) and diamino diphenyl sulfone (60 g) were added to a solution of the above reaction product (486 g) in N,N-dimethylformamide (DMF 165 g) and stirred for about 5 to 10 minutes to give a varnish in which 50% by weight is in solid form. Impregnate 7628 glass cloth with the varnish to make a B-stage prepreg. Press the prepreg at a temperature of 180° C. and a pressure of 250 psi for about 1.5 hours to obtain a copper/prepreg/copper laminate of 1.6 mm thickness with properties shown in Table 1.

EXAMPLE 2

Barbituric acid (19 g) was added to a mixture of DER 331 (380 g, a nonbromine-containing epoxy resin from Dow Chemical Co), DER 542 (120 g), and XOX Nippon BREN-S (60 g, a bromine-containing epoxy resin from Nippon Yoka) in N,N-dimethylformamide (DMF, 240 g), and reacted for about 2 hours at 145° C. TDI (126 g, toluene diisocyanate) and hexamethylenetetraamine (0.4 g) were added to the reaction mixture and reacted for about 3 hours at 150° C. An amber-colored, fire-resistant and heat-resistant viscous liquid was obtained having an epoxide equivalent of 470 after it is cooled. Aetone (480 g) and dicyandiamide (26 g) were further added to said liquid, and stirred for about 1 hour to obtain a prepreg varnish in which 51% by weight is in solid form. Impregnate 7628 glass cloth with the prepreg varnish to form a B-stage prepreg. Press the prepreg at a temperature of 180° C. and a pressure of 250 psi for about 1.5 hours to obtain a copper/prepreg/copper laminate of 1.6 mm thickness with properties shown in Table 1.

COMPARATIVE EXAMPLE 1

DER 331 (380 g, a nonbromine-containing epoxy resin from Dow Chemical Co.) was treated with MDI (140 g, methylene diphenylisocyanate) and tetraethylammonium bromide at 155° C. for 4 hours. An amber-colored resin was obtained. The amber-colored resin having an epoxide equivalent of 410 was stirred and heated with MEK (400 g, methyl ethyl ketone), DMF (160 g, N,N-dimethylformamide) and diamino diphenyl sulfone (75 g) to give a prepreg varnish in which 53% by weight is in solid form. Impregnate 7628 glass cloth with the prepreg varnish obtained to make a B-stage prepreg. Press the prepreg at a temperature of 180° C. and a pressure of 250 psi for about 1.5 hours to obtain a copper/prepreg/copper laminate of 1.6 mm thickness with properties shown in Table 1.

COMPARATIVE EXAMPLE 2

TDI (126 g, toluene diisocyanate) and hexamethylenetetraamine (0.4 g) were added to a solution of DER 331 (380 g), DER 542 (120 g), and XOX Nippon BREN-S (60 g) in DMF (220 g), and were heated at 150° C. for about 3 hours. An amber-colored fire-resistant viscous product having an epoxide equivalent of 485 was obtained after cooling. Acetone (480 g) and dicyandiamide (25 g) were added to said viscous product to give a prepreg varnish in which 52% by weight is in solid form after the addition of acetone (480 g) and dicyandiamide (25 g) and stirring for about 1 hour. Impregnate 7628 glass cloth with the prepreg varnish to make a B-stage prepreg. Press the prepreg at a temperature of 180° C. and a pressure of 250 psi for about 1.5 hour to obtain a copper/prepreg/copper laminate of 1.6 mm thickness with properties shown in Table 1.

The remarkable improvement in essential properties obtained from the material according to this invention is revealed by Table 1.

TABLE 1

| | | | \multicolumn{5}{c|}{The properties of the laminates} |
| Terms | Unit | Condition | Exp 1 | Exp 2 | Comp Exp 1 | Comp Exp 2 | Conventional FR-4 |
| --- | --- | --- | --- | --- | --- | --- | --- |
| Tg | °C. | TMA | 180 | 162 | 168 | 155 | 130 |
| Peel Strength | lb/in | 25° C. | 11 | 11 | 10 | 10 | 10 |
| | | 170° C. | 8 | 8.5 | 7 | 7 | 4 |
| Dielectric Constant (MHz) | — | ASTM-150 | 4.5 | 4.6 | 4.6 | 4.7 | 4.7 |
| Bromine Content (including glass cloth) | % | | 5 | 5 | 0 | 5 | 11 |
| Volume Resistivity | Ohm-Cm | ASTM-257 | $1.2 \times 10^{14}$ | $2 \times 10^{14}$ | $1.1 \times 10^{14}$ | $1 \times 10^{14}$ | $1 \times 10^{14}$ |
| Surface Resistivity | Ohm | ASTM-257 | $2 \times 10^{12}$ | $1.5 \times 10^{12}$ | $1.1 \times 10^{12}$ | $1 \times 10^{12}$ | $1 \times 10^{12}$ |
| Z-axis CTE | | <Tg | 50 | 50 | 60 | 60 | 60 |
| (inch/inch °C.) $\times 10^{-6}$ | | >Tg | 240 | 247 | 300 | 280 | 350 |
| Moisture adsorption | % | ASTM D-520 | 0.18 | 0.2 | 0.2 | 0.25 | 0.35 |
| Flammability | | UL-94 | V-O | V-O | | V-O | V-O |

What is claimed is:

1. A resinous material for the manufacture of printed circuits board, said material is obtained by the following steps:
  (a) treating a mixture of bromine-containing and non-bromine-containing epoxy resins with a secondary diamine selected from the group consisting of (i)

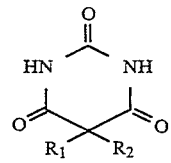

wherein each $R_1$ and $R_2$ is independently H, $CH_3$, $C_2H_5$ or $C_6H_5$;

(ii)

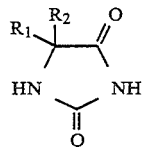

wherein each $R_1$ and $R_2$ is independently H, $CH_3$, $C_2H_5$ or $C_6H_5$; and at from about 100° C. to about 150° C. for from about 1 to about 5 hours in the presence of a tertiary amine as a catalyst to form a modified epoxy resin,
(b) adding a polyisocyanate and heating at from about 130° C. to about 160° C. for from about 3 to about 6 hours in the presence of an encyclization catalyst, and
(c) dissolving the product obtained from step b) in a solvent with a curing agent to form a B-stage prepreg varnish.

2. A resinous material as claimed in claim 1, in which the molar ratio of the secondary diamine to the epoxy group of the epoxy resin obtained in step (a) is from about 0.01:1 to about 0.5:1.

3. A resinous material as claimed in claim 1, in which the equivalent ratio of hydroxyl group to isocyanate group is from about 0.1:1 to about 0.5:1.

4. A resinous material as claimed in claim 1, in which the equivalent ratio the isocyanate group to the epoxy group is from about 0.25:1 to about 0.8:1.

5. A resinous material as claimed in claim 1, in which the amount of encyclization catalyst is from about 0.01% to about 1% of the combined weight of the epoxy resins, polyisocyanate, and secondary diamine.

6. A resinous material as claimed in claim 1, wherein the equivalent ratio of the dissolved product to the curing agent added is from about 0.85:1 to about 1.0:1.

7. A resinous material as claimed in claim 1, in which each bromine- and nonbromine- containing epoxy resin is independently selected from the group consisting of:

(i)

wherein
R is an alkyl group of 1–4 carbon atoms,
$R_1$ is H or Br,
n is a integer from 0 to 2 and the epoxide equivalent is from 150 to 575;

(ii)

wherein
$R_1$ is H or $CH_3$, $R_2$ is H and Br,
n is a integer from 1 to 4 and the epoxide equivalent is from 150 to 350

(iii)

wherein each $R_1$ and $R_2$ is independently H or $CH_3$, or (iv)

8. A resinous material as claimed in claim 1, in which the polyisocyanate is selected from the group consisting of:

(i)

(ii)

(iii) and (iv)

wherein n is an integer from 0 to 2.

9. A resinous material as claimed in claim 1, wherein the curing agent is selected from the group consisting of:
(a) diamine of the formula $NH_2RNH_2$ wherein R is:

-continued
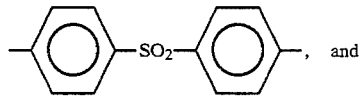, and
-continued
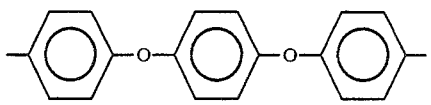
(b) dicyandiamide
(c) dianhydride, and
(d) polycarboxylic acid
10. A resinous material as claimed in claim 1, wherein the encyclization catalyst is selected from the group consisting of:
a) tertiary amine
b) tertiary alcoholate salt, and
c) quarternary ammonium salt.
* * * * *